(12) United States Patent
Ahn et al.

(10) Patent No.: US 7,645,812 B2
(45) Date of Patent: Jan. 12, 2010

(54) THIN FILM TRANSISTOR AND FLAT PANEL DISPLAY INCLUDING THE SAME

(75) Inventors: Taek Ahn, Suwon-si (KR); Min-Chul Suh, Suwon-si (KR); Jae-Bon Koo, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 448 days.

(21) Appl. No.: 11/339,657

(22) Filed: Jan. 26, 2006

(65) Prior Publication Data

US 2006/0172149 A1    Aug. 3, 2006

(30) Foreign Application Priority Data

Jan. 29, 2005    (KR)    ............... 10-2005-0008339

(51) Int. Cl.
*A61K 6/083*    (2006.01)
(52) U.S. Cl. .................... 522/57; 524/876
(58) Field of Classification Search ........... 522/57; 524/876
See application file for complete search history.

(56) References Cited

U.S. PATENT DOCUMENTS

| | | | |
|---|---|---|---|
| 2004/0056588 | A1 | 3/2004 | Nozawa |
| 2004/0180984 | A1* | 9/2004 | Lee et al. ............ 522/57 |
| 2005/0100737 | A1* | 5/2005 | Shim et al. ......... 428/411.1 |

FOREIGN PATENT DOCUMENTS

KR    1020030009729    2/2003

OTHER PUBLICATIONS

*Office action* from the Korean Intellectual Property Office issued in Applicant's corresponding Korean Patent Application No. 10-2005-0008339 dated Jun. 28, 2006.

* cited by examiner

*Primary Examiner*—Edward J Cain
(74) *Attorney, Agent, or Firm*—Robert E. Bushnell, Esq.

(57) ABSTRACT

A poly(para-phenylenevinylene) (PPV) compound for forming a buffer layer of a thin film transistor represented by

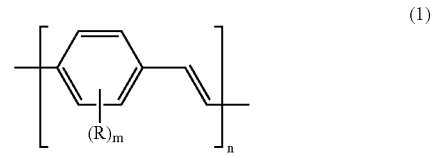

(1)

where R is a C1-C20 silyl group substituted with cyclohexyl or phenyl, m is an integer from 2 to 4, and n is an integer from 1 to 3,000; a composition for forming a buffer layer of a thin film transistor that is used to form the compound represented by formula 1 and includes a halo precursor polymer, a photobase generator, and a solvent; a thin film transistor including a buffer layer which is manufactured using the PPV compound; and a flat panel display including the thin film transistor. A patterned buffer layer can be formed under an organic semiconductor layer of an organic TFT by photolithography patterning using the silicon-containing PPV precursor. Accordingly, the alignment of the organic semiconductor layer of the organic TFT can be improved, and thereby, the characteristics of the organic TFT can be improved.

5 Claims, 4 Drawing Sheets

1 : SPINCOATING

2 : EXPOSING

3 : DEVELOPING - DRYING

THIN FILM TRANSISTOR AND FLAT PANEL DISPLAY INCLUDING THE SAME

CROSS-REFERENCE TO RELATED PATENT APPLICATIONS AND CLAIM OF PRIORITY

This application claims the benefit of Korean Patent Application No. 10-2005-0008339, filed on Jan. 29, 2005, in the Korean Intellectual Property Office, the disclosure of which is incorporated herein in its entirety by reference.

BACKGROUND OF THE INVENTION

1. Field of the Invention

The present invention relates to a thin film transistor and a flat panel display including the same, and more particularly, to a paraphenylene vinylene compound and a poly(para-phenylene vinylene) (PPV) compound for forming a buffer layer with a micro pattern, a thin film transistor that improves the alignment of an organic semiconductor layer using the PPV compound, and a flat panel display including the thin film transistor.

2. Description of the Related Art

Thin film transistors (TFTs), which are used in flat panel displays, such as liquid crystalline displays (LCDs), organic or inorganic light-emitting displays (or electroluminescent devices (ELDs)), and the like, act as switching devices that control the operation of pixels, and as driving devices that drive the pixels.

A TFT includes a semiconductor layer which includes source and drain regions doped with a highly concentrated impurity and a channel region formed therebetween, a gate electrode that is insulated from the semiconductor layer and disposed above the channel region, and source and drain electrodes corresponding to the source and drain regions, respectively.

Silicon TFTs including semiconductor layers formed of silicon have many disadvantages. For example, silicon TFTs have high manufacturing costs, can be easily broken by an outer impact, and must be manufactured at 300° C. or higher, which is not desirable for a plastic substrate.

Since a TFT is used as the switching device that controls pixels and as the driving device that drives the pixels in flat panel displays, such as LCDs, ELDs, and the like, which have become large, thin, and flexible, many attempts are being made to replace the conventional glass substrate with a plastic substrate. In order to use the plastic substrate, a low temperature process, not the high temperature process, is required.

This is possible when the semiconductor layer of the TFT is composed of an organic material. Thus, more active research into organic TFTs is being conducted.

However, when a plurality of organic TFTs are manufactured at the same time, the resulting organic semiconductor layers are non-uniform. That is, organic semiconductor layers of organic TFTs align in different directions, and thus, the organic TFTs have different threshold voltages and other characteristics.

Therefore, a flat panel display including organic TFTs fails to form precise, clear images corresponding to input image information.

According to US Patent Publication No. 2004-0056588, an excellent optical film can be formed using a poly(para-phenylene vinylene) precursor, thus obtaining an organic EL device with good brightness and high efficiency. However, US Patent Publication No. 2004-0056588 does not disclose a method of improving the alignment of the organic semiconductor. An improvement of the alignment of the organic semiconductor requires the development of a method of patterning a buffer layer.

SUMMARY OF THE INVENTION

The present invention provides a poly(para-phenylenevinylene) (PPV) compound for a buffer layer of a thin film transistor (TFT) that can improve the alignment of an organic semiconductor.

The present invention also provides a composition for forming the PPV compound including a precursor, a photobase generator, and a solvent The present invention also provides a TFT prepared by using the composition for the buffer layer and a method of manufacturing the TFT.

The present invention also provides a flat panel display including the TFT.

According to an aspect of the present invention, there is provided a polyparaphenylenevinylene (PPV) compound for forming a buffer layer of a thin film transistor represented by

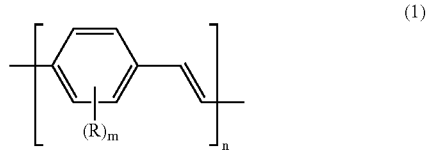

(1)

where R is a C1-C20 silyl group substituted with cyclohexyl or phenyl, m is an integer from 2 to 4, preferably 2 or 4, and n is an integer, preferably from 1 to 3,000.

According to still another aspect of the present invention, there is provided a composition for forming a buffer layer of a thin film transistor which is used to form the PPV compound, the composition including: a photobase generator; a solvent; and a precursor represented by

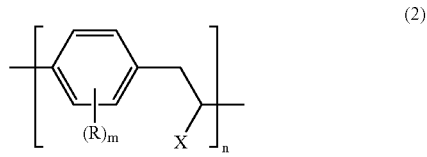

(2)

where R is a C1-C20 silyl group substituted with cyclohexyl or phenyl; m is an integer from 2 to 4; X is Cl, Br, or I; and n is an integer from 1 to 3,000.

According to yet another aspect of the present invention, there is provided a thin film transistor including: a gate electrode; source and drain electrodes insulated from the gate electrode; an organic semiconductor layer that is insulated from the gate electrode and contacts the source and drain electrodes; and a buffer layer comprising the PPV compound represented by formula 1.

According to still another aspect of the present invention, there is provided a method of manufacturing a thin film transistor, the method including: forming a buffer layer by depositing the composition for forming a buffer layer on a substrate, and exposing and developing the resulting substrate according to a predetermined pattern; forming source and drain electrodes on the buffer layer; forming an organic semiconductor layer contacting the source and drain electrodes; forming a gate insulating layer to cover the organic semiconductor layer; and forming a gate electrode on the gate insulating layer.

According to another aspect of the present invention, there is provided a flat panel display including the thin film transistor.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
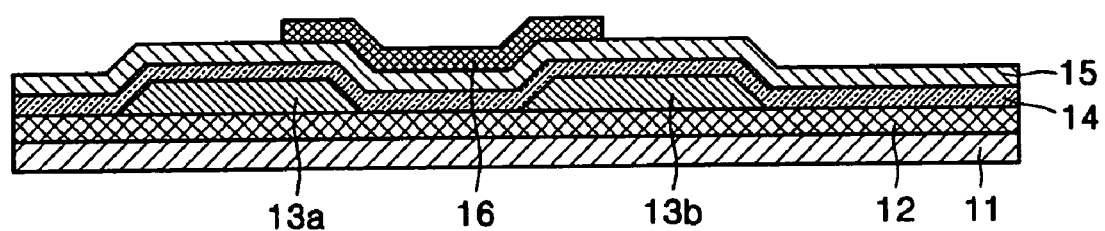
FIG. 1 is a sectional view of an organic thin film transistor (TFT) including a buffer layer according to an embodiment o the present invention.

A poly(para-phenylenevinylene) (PPV) compound for forming a micro-patterned buffer layer of a thin film transistor (TFT) according to an embodiment of the present invention is represented by formula 1:

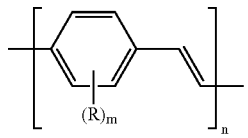

(1)

where R is a C1-C20 silyl group substituted with cyclohexyl or phenyl, and m is an integer from 2 to 4. Formula 1 features a conjugated structure in which a phenylene backbone and ethylene, which is a connecting group, are alternatively connected. The 'm' in formula 1 is preferably 2 or 4 because in a non-symmetrical structure the substituent can be removed in a photolithography process for forming the buffer layer. The 'n' in formula 1 may vary according to the need of those skilled in the art, and thus is not limited. For example, 'n' may be an integer from 1 to 3,000.

In the present specification and claims, the term "paraphenylene vinylene" includes paraphenylenevinylene monomer as well as poly(p-phenylene vinylene). Also, the term "poly(para-phenylene vinylene)" includes a para-phenylene compound when n in Formula 1 is 1. Likewise, the term "halo precursor polymer" in the specification includes a halo precursor monomer for a para-phenylene compound when n of Formula 1 as well as a polymer.

The silyl group that is introduced as a substituent is not limited. The silyl group may further include, in addition to the cyclohexyl or phenyl substituent, a linear or branched C1-C20 alkyl group.

An exemplary embodiment of the compound represented by formula 1 may be a compound represented by Formula 1a:

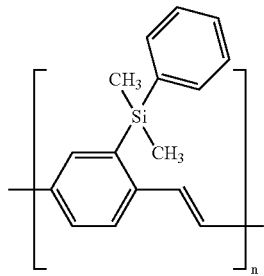

(1a)

where n is an integer from 1 to 3,000.

A composition for forming a buffer layer of a TFT according to an embodiment of the present invention includes a halo precursor polymer represented by formula 2, a photobase generator, and a solvent, and is used to form the paraphenylenevinylene compound represented by formula 1.

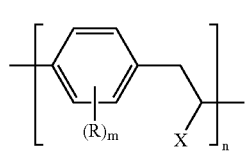

(2)

where R is a C1-C20 silyl group substituted with cyclohexyl or phenyl; m is an integer from 2 to 4; X is Cl, Br, or I; and n is an integer, preferably from 1 to 3,000.

Any material that can generate a base when exposed to light can be used as the photobase generator. In detail, the photobase generator may generate amine by combining an ester group and nitrogen.

The photobase generator that can react with the halo precursor polymer when exposed to light, such as UV light, may be represented by formula 3:

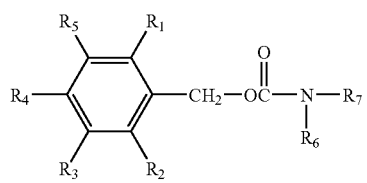

(3)

where $R_1$, $R_2$, $R_3$, $R_4$, and $R_5$ are each independently hydrogen, a C1-C10 alkyl group, a phenyl group, a C1-C10 alkoxy group, an $N(R')_2$ group, a $Si(R'')_3$ group, or a nitro group where R' and R" are each independently hydrogen and a C1-C10 alkyl group and at least one of $R_1$ and $R_2$ is the nitro group; and $R_6$ and $R_7$ are each independently hydrogen, a C1-C10 alkyl group, or a substituted or unsubstituted C6-C20 aryl group.

The photo generator may be (2,6-dinitrobenzyl)oxycarbonyldiphenylamine.

The amount of the photobase generator may range from 0.1 to 10 parts by weight based on 100 parts by weight of the halo precursor polymer. When the amount of the photobase generator is less than 0.1 parts by weight, the base is not sufficiently generated. When the amount of the photobase generator is greater than 10 parts by weight, side reactions can occur among generated bases or between the generated base and a non-reacted photobase generator.

When the photobase generator represented by formula 3 is exposed to UV light, a base is generated. The generated base reacts with the halogen of the halo precursor represented by formula 2 and thus a base catalyst dehydro-halogenation reaction ($E_2$ reaction) occurs. That is, the halo precursor polymer represented by formula 2 is converted into the conjugated polymer represented by formula 1 by the base.

The solvent may be a conventional organic solvent, but is not limited thereto. The solvent may include at least one compound selected from cyclohexanone, ethylcarbitol, butylcarbitol, ethylcarbitolacetate, butylcarbitolacetate, texanol, terpineol, dipropyleneglycolmethylether, dipropyleneglycolethyleter, dipropyleneglycolmonomethyletheracetate, ¥-butyrolactone, cellosolveacetate, butylcellosolveacetate, and tripropyleneglycol, preferably, cyclohexanone. The amount of the solvent may range from 1 to 20 parts by weight, preferably, 1 to 10 parts by weight based on 100 parts by weight of the precursor polymer. When the amount of the solvent is less than 1 part by weight, the precursor polymer does not sufficiently dissolve in the solvent. When the amount of the solvent is greater than 20 parts by weight, the viscosity of the solution is undesirably decreased.

A TFT according to an embodiment of the present invention includes a gate electrode, source and drain electrodes that is insulated from the gate electrode, an organic semiconductor layer that is insulated from the gate electrode and contacts the source and drain electrodes, and a buffer layer comprising the paraphenylenevinylene compound.

The buffer layer can be formed under the organic semiconductor layer. Also, the organic semiconductor layer may contact a micro pattern formed on the buffer layer.

As illustrated in FIG. 1, an organic TFT according to an embodiment of the present invention includes a predetermined micro-patterned buffer layer 12 formed on a substrate 11, source and drain electrodes 13a and 13b formed on the buffer layer 12, and an organic semiconductor layer 14 that has source and drain regions and a channel region connecting the source and drain regions and covers the source and drain electrodes 13a and 13b, an insulating layer 15 covering the organic semiconductor layer 14, and a gate electrode 16 with a predetermined pattern formed on the insulating layer 15.

The organic TFT is covered by a passivation layer, which has a single-layer or multi-layer structure and comprises an organic material, an inorganic material, or organic/inorganic composite. Since the buffer layer 12 has a micro parallel pattern extending in the direction from the source electrode 13a to the drain electrode 13b, the organic semiconductor layer 14 formed on the buffer layer 12 is aligned in the same direction. Accordingly, organic TFTs that are manufactured at the same time may have uniform threshold voltages.

Figure 2:
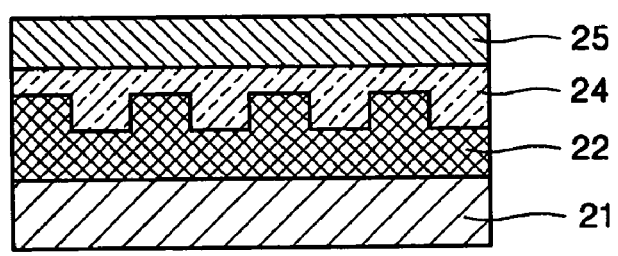
FIG. 2 is a sectional view of an organic TFT including a micro-patterned buffer layer.

FIG. 2 is a sectional view of an organic TFT including a micro-patterned buffer layer according to an, embodiment of the present invention. Referring to FIG. 2, a buffer layer 22 having a micro parallel pattern is formed on a substrate 21, and an organic semiconductor layer 24 is formed on the micro parallel pattern of the buffer layer 22. In this structure, the organic semiconductor layer 24 can be aligned in a predetermined direction. An insulating layer 25 covers the organic semiconductor layer 24. Organic TFTs having this structure may have uniform characteristics. However, the structure of the organic TFT is not limited thereto.

A method of forming a buffer layer of a TFT according to an embodiment of the present invention includes: forming a photoresist layer by coating a substrate with the composition for forming a buffer layer that includes the halo precursor polymer represented by formula 2, the photobase generator, and the solvent; exposing the photoresist layer through a predetermined pattern; and developing the resulting photoresist to form a patterned buffer layer.

Figure 3:
FIG. 3 illustrates a method of micro patterning a buffer layer according to an embodiment of the present invention.
Figure 3:
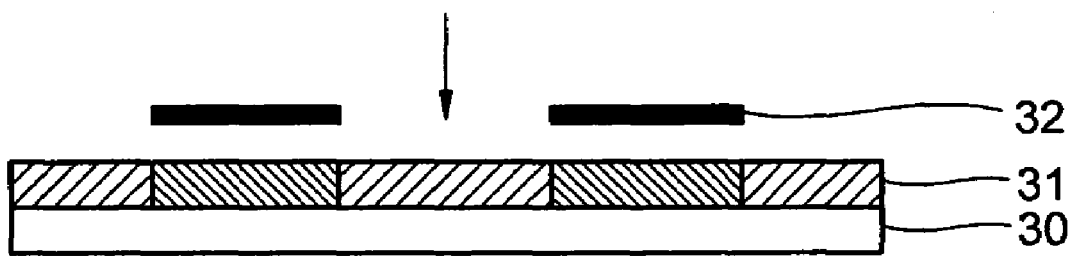
Figure 3:
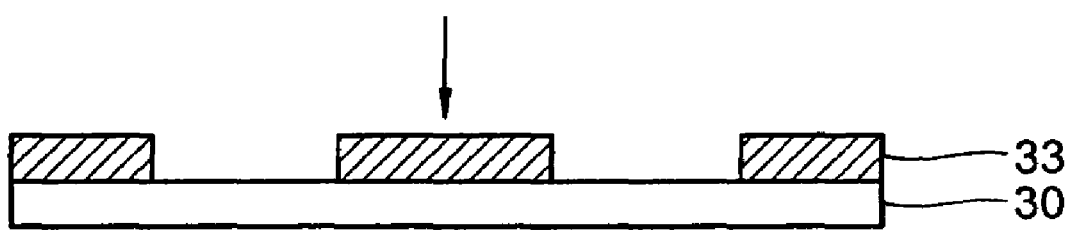

FIG. 3 illustrates a method of manufacturing a buffer layer according to an embodiment of the present invention. In operation 1, the composition for forming a buffer layer according to the present invention is spin coated and dried on a substrate 30, thus forming a photoresist layer 31. In operation 2, the photoresist layer 31 is exposed to light, using a photomask 32 to form a predetermined pattern therein. In operation 3, the resulting structure is developed and dried to form a patterned buffer layer 33.

The adoption of the method of forming a buffer layer according to the present invention can simplify the manufacturing process and decrease the manufacturing costs because the patterned buffer layer can be formed using the composition for forming a buffer layer instead of a conventional photoresist (PR) composition. Accordingly, by using the above-mentioned technique, a micro-patterned buffer layer that comprises the conjugated polymer formed using the composition including the halo precursor polymer, photobase generator, and the solvent, can be formed.

The thickness of the composition coated on the substrate may range from about 30 nm to about 1,000 nm (1 μm), and can be controlled by adjusting the concentration of the precursor polymer solution.

In the exposure operation, the photoresist layer 31 is exposed to a UV exposing apparatus including a high-pressure mercury lamp with the wavelength of 500 nm or less through a Cr photomask having a desired pattern for 1 to 10 minutes.

In operation 2, a base is generated in the portion of the photoresist 31 exposed to UV light by the photobase generator. The generated base reacts with the halogen of the halo precursor polymer represented by formula 2 so that a base catalyst dehydro-halogenation reaction ($E_2$ reaction) occurs. Through the $E_2$ reaction, the halo precursor polymer can be converted into the conjugated polymer by the base.

The reaction scheme for producing the base from the photobase generator in the exposure operation can be illustrated in

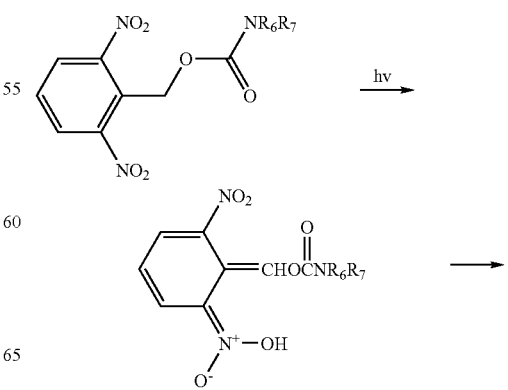

-continued

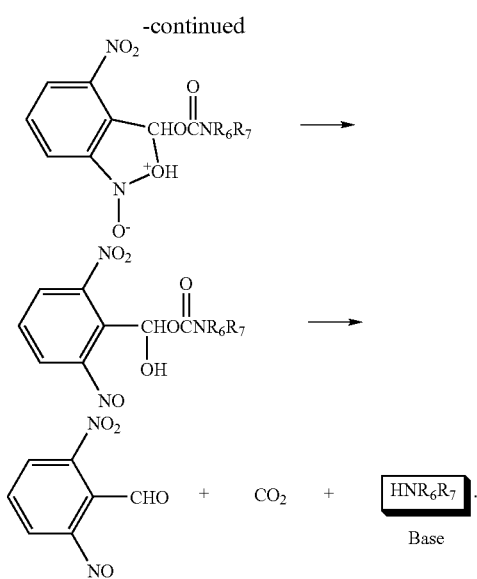

In the photobase generator represented by formula 3 used in this reaction scheme, $R_1$ and $R_2$ are nitro groups; $R_3$, $R_4$, and $R_5$ are hydrogen; and $R_6$ and $R_7$ are the same as described in formula 3. However, photobase generator is not limited thereto.

In the development operation, the resulting structure is developed using an organic solvent. The organic solvent may include, but is not limited thereto, at least one compound selected from cyclohexanone, ethylcarbitol, butylcarbitol, ethylcarbitolacetate, butylcarbitolacetate, texanol, terpineol, dipropyleneglycolmethylether, dipropyleneglycolethylether, dipropyleneglycolmonomethyletheracetate, ɣ-butyrolactone, cellosolveacetate, butylcellosolveacetate, and tripropyleneglycol.

The portion of the photoresist 31 that is converted to the conjugated polymer does not dissolve in the organic solvent because of its hardness. On the other hand, the portion of the photoresist 31 that is not exposed does not generate a base because the photobase generator does not react. Accordingly, the halo precursor polymer and the photobase generator can be washed using the organic solvent, thus forming the micro-patterned buffer layer.

Figure 4:
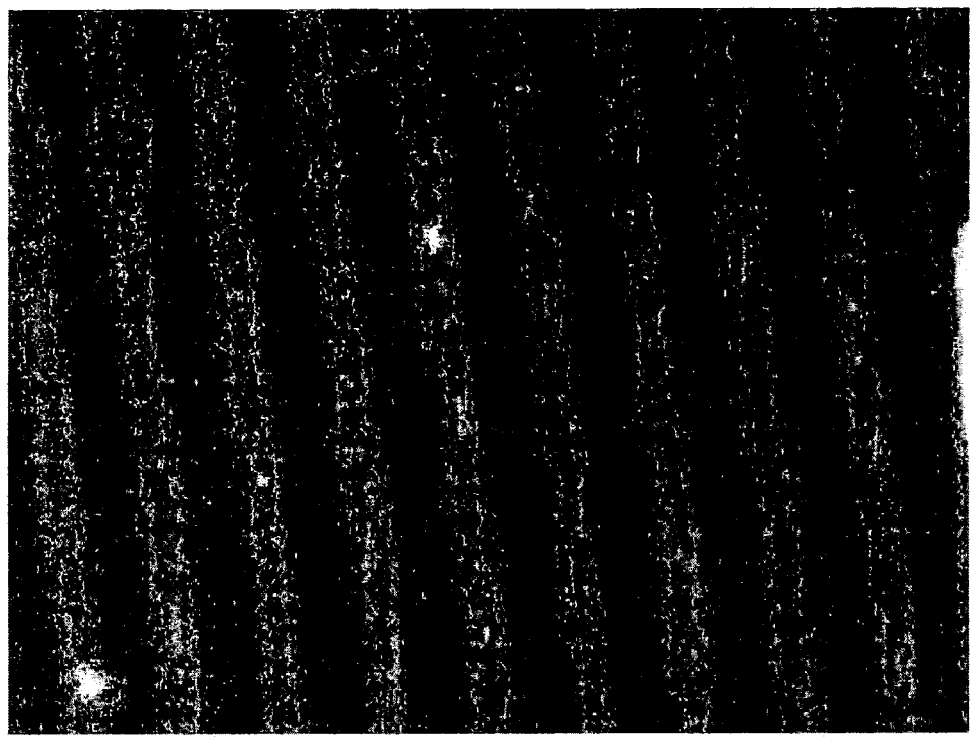
FIG. 4 is an image of a micro-patterned buffer layer according to an embodiment of the present invention.

FIG. 4 is a photograph of a buffer layer having a micro parallel pattern formed under the organic semiconductor layer of the TFT.

A method of manufacturing a TFT according to an embodiment of the present invention includes: forming a buffer layer having a pattern by coating the substrate with the composition for forming a buffer layer, exposing the coated substrate to light through a photomask with a predetermined pattern, and developing the exposed substrate coated with the composition; forming source and drain electrodes on the buffer layer; forming an organic semiconductor layer contacting the source and drain electrodes; forming a gate insulating layer covering the organic semiconductor layer; and forming a gate electrode on the gate insulating layer.

According to the present invention, the organic semiconductor layer can be automatically aligned by the buffer layer that is patterned under the organic semiconductor layer. As a result, an aligning process for the organic semiconductor layer using direct and chemical methods is not required. Such an automatic alignment of the organic semiconductor layer may improve uniformity of the organic semiconductor layer, so that the threshold voltage (Vth) and performance of the TFT can be increased.

Although the patterned buffer layer is interposed between the substrate and the organic semiconductor layer in the present embodiment, the location of the patterned buffer layer is not limited thereto. For example, where a gate electrode and a gate insulating layer covering the gate electrode are sequentially stacked on a substrate, the patterned buffer layer can be interposed between the gate insulating layer and an organic semiconductor layer. The organic semiconductor layer formed on the gate insulating layer has the alignment extending in the same direction. Accordingly, organic TFTs including the organic semiconductor layers have uniform threshold voltages.

The organic semiconductor layer comprises an organic semiconductor material, such as pentacene, tetracene, anthracene, naphthalene, α-6-thiophene, α-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaphenylenevinylene and derivatives thereof, polyparaphenylene and derivatives thereof, polyfluorene and derivatives thereof, polythiophenevinylene and derivatives thereof, polythiophene-heteroaromatic copolymer and derivatives thereof, oligoacene of naphthalene and derivatives thereof, oligothiophene of α-5-thiophene and derivatives thereof, metal phthalocyanine, metal-free phthalocyanine and derivatives thereof, pyromelitic acid dianhydride and derivatives thereof, pyromelitic acid diimide and derivatives thereof, perylene tetracarboxylic acid dianhydride and derivatives thereof, perylene tetracarboxylic acid diimide and derivatives thereof, and the like.

Since the organic TFT includes the buffer layer having the micro parallel pattern extending in the same direction, the organic semiconductor layer formed on the buffer layer can be aligned in the same direction with the buffer layer. Accordingly, organic TFTs that are manufactured at the same time have uniform threshold voltages and thus better electrical characteristics.

Figure 5:
FIG. 5 is SEM images of micro-patterned buffer layers according to an embodiment of the present invention.

FIG. 5 is SEM images of patterned buffer layers according to an embodiment of the present invention with pattern widths of 10 μm, 20 μm, and 30 μm, respectively. Organic TFTs having these buffer layers are suitable for an apparatus, such as a flat panel display, that requires a plurality of organic TFTs with identical characteristics, because they are produced with identical characteristics such as uniform threshold voltages in the manufacturing process.

That is, when the operation of a pixel including at least one organic TFT with different characteristics is controlled, an image according to an input image signal cannot be formed precisely, and thus a clear image cannot be formed. However, the use of organic TFTs according to the present invention in a flat panel display results in realization of precise and clear images.

A flat panel display including organic TFTs according to embodiments of the present invention may be an ELD display, a LCD, or the like. The structure of the ELD will now be described.

An ELD includes various colored pixels according to the color emitted from an emission layer, for example, red, green, and blue pixels. Each of the pixels includes a self-emitting organic light-emitting device (OLED) and at least one TFT connected to the self-emitting light-emitting device. The TFT may be an organic TFT according to the present invention. The pixel may further include a capacitor and the like.

The light-emitting device is operated by current and emits light. The light-emitting device emits red, green, or blue light according to the flow of the current between electrodes to form an image. The ELD includes a pixel electrode connected to one of the source electrode and the drain electrode of the TFT, an opposite electrode that covers all of the pixels or covers each of the pixels, and a middle layer including at least one emission layer interposed between the pixel electrode and the opposite electrode. However, the structure of the electroluminescent device is not limited thereto.

Figure 6:
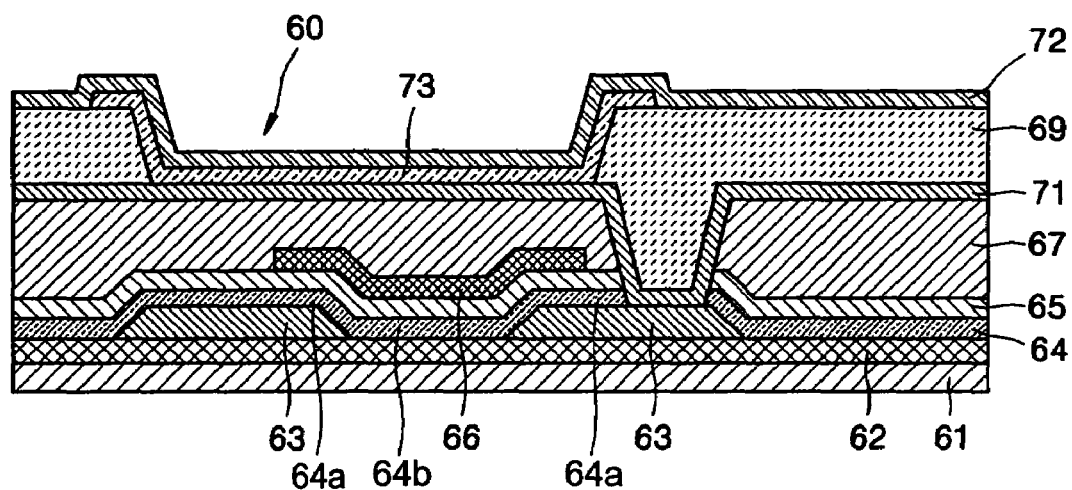
FIG. 6 is a sectional view of a flat panel display according to an embodiment of the present invention.

FIG. 6 is a sectional view of a flat panel display according to an embodiment of the present invention. Referring to FIG. 6, a buffer layer 62 having a predetermined micro pattern is formed on a substrate 61. Source and drain electrodes 63 are formed on the buffer layer 62. An organic semiconductor layer 64 covers the source and drain electrodes 63. The organic semiconductor layer 64 includes source and drain regions 64a, and a channel region 64b connecting the source and drain regions.

After the organic semiconductor layer 64 is formed, an insulating layer 65 covering the organic semiconductor layer 64 is formed. A gate electrode 66 with a predetermined pattern is formed on the insulating layer 65 to complete a TFT. The resulting TFT is covered by a passivation layer 67 having a single- or multi-layered structure comprising an organic material, an inorganic material, or organic/inorganic composite.

A pixel electrode 71 of a light-emitting device 60 is formed on the passivation layer 67, and a pixel defining layer 69 is formed on the pixel electrode 71. A predetermined opening is formed in the pixel defining layer 69 and then, an organic emission layer 73 of the electroluminescent device 60 is formed.

The electroluminescent device 60, which emits red, green, or blue light according to the flow of current to produce predetermined image information, includes the pixel electrode 71 connected to the source and drain electrodes 63 of the TFT, an opposite electrode 72 covering all of the pixels of the flat panel display, and the organic emission layer 73, which emits light, between the pixel electrode 71 and the opposite electrode 72. The pixel electrode 71 is insulated from the opposite electrode 72. The pixel electrode 71 and the opposite electrode 72 have opposite polarities and provide a voltage to the organic emission layer 73 to emit light.

The pixel electrode 71 acts as an anode electrode, and the opposite electrode 72 acts as a cathode electrode. Alternatively, the pixel electrode 71 can act as a cathode electrode, and the opposite electrode 72 can act as an anode electrode. The pixel electrode 71 may be formed separately for each of the pixels, and the opposite electrode 72 may be formed for covering all of the pixels.

The pixel electrode 71 can be a transparent electrode or a reflective electrode. When the pixel electrode 71 is a transparent electrode, it can be composed of ITO, IZO, ZnO, or $In_2O_3$. When the pixel electrode 71 is a reflective electrode, it can be formed by first forming a reflective layer composed of Ag, Mg, Al, Pt, Pd, Au, Ni, Nd, Ir, Cr, or a compound of these and then forming a transparent layer composed of ITO, IZO, ZnO, or $In_2O_3$ thereon.

The opposite electrode 72 can be a transparent electrode or a reflective electrode. When the opposite electrode 72 is a transparent electrode, it can be formed by first depositing Li, Ca, LiF/Ca, LiF/Al, Al, Ag, Mg, or a compound of these on the middle layer and then forming thereon an assistant electrode layer or a bus electrode line composed of a transparent electrode forming material, such as ITO, IZO, ZnO, $In_2O_3$, or the like. When the opposite electrode 72 is a reflective electrode, it can be formed by depositing Li, Ca, LiF/Ca, LiF/Al, Al, Ag, Mg, or a compound of these on the entire area. Although the opposite electrode can further include the assistant electrode layer or the bus electrode line, in the present embodiment the opposite electrode includes only a layer formed on the organic emission layer 73. In addition, a protective layer can be further formed on the opposite electrode 72.

The organic emission layer 73 may be a small molecule organic layer or a polymer organic layer.

When the organic emission layer 73 is a small molecule organic layer, the organic emission layer 73 may have a single- or multi-layered structure including a hole injection layer (HIL), a hole transport layer (HTL), an emission layer (EML), an electron transport layer (ETL), an electron injection layer (EIL), and the like. A small molecule organic material that forms the small molecule organic layer may be copper phthalocyanine (CuPc), (N,N'-Di(naphthalene-1-yl)-N, N'-diphenyl-benzidine: NPB), tris-8-hydroxyquinoline aluminum(Alq3), or the like. The small molecule organic layer may be formed by vacuum deposition. The structure of the small molecule organic layer is not limited to the above description.

When the organic emission layer 73 is a polymer organic layer, the organic emission layer 73 may include an HTL and an EML. The polymer HTL may be formed by inkjet printing or spin coating poly-(2,4)-ethylene-dihydroxy thiophene (PEDOT), polyaniline (PANI), or the like. The polymer EML may be formed by inkjet printing, spin coating, or laser thermal transferring poly-p-phenylenevinylene (PPV), soluble PPV's, cyano-PPV, polyfluorene, or the like. The structure of the polymer organic layer is not limited to the above description.

In the ELD with the above-mentioned structure, whether each of the pixels emits light or not is determined by controlling the flow of current to the pixel electrode connected to at least one of the organic TFTs with uniform threshold voltages, which are obtained by aligning the organic semiconductor layer in the same direction.

The organic TFTs can be used in any device that include organic TFTs. For example, the organic TFTs can be used in various flat panel displays, such as ELDs and LCDs, electronic sheets, smart cards, smart tags, plastic chips for RFID, and the like.

The present invention will now be described in further detail with reference to the following Example and Comparative Example. The example is for illustrative purposes only, and is not intended to limit the scope of the invention.

EXAMPLE 1

Manufacture of Organic TFT (1) Manufacture of 2-dimethylphenylsilyl-p-xylene 2.23 g (92.0 mmol) of Mg that was activated using 5M % 1,2-dibromoethane at 80° C. was slowly added to a solution prepared by dissolving 10.0 g (54.0 mmol) of 2-bromo-p-xylene in anhydrous tetrohydrofuran. When the Mg was completely dissolved, 15.4 ml (92.0 mmol) of chlorodimethylphenylsilane was added to the resulting mixed solution. The mixed solution was heated, and then refluxed for 6 hours. The reaction was stopped by adding a dilute HCl aqueous solution to the refluxed solution. A resulting THF layer was separated and washed with water several times. The solvent was removed using a rotary evaporator. The residue was vaporized under a vacuum condition to produce a colorless liquid compound (yield: 48%, 6.2 g.)

(2) Manufacture of 2-dimethylphenylsilyl-1,4-bis(bromomethyl) benzene 11.5 g (64.0 mmol) of N-bromosuccinimide, and benzoyl peroxide as an initiator were added to a solution prepared by dissolving 7.0 g (29.0 mmol) of 2-dimethylphenylsilyl-p-xylene in 100 ml of $CCl_4$. The resulting mixed solution was heated at 80° C. for 4 hours in a nitrogen atmosphere, and then refluxed. When succinimide appeared on the surface of the reaction solution, the reaction was stopped. A resulting organic layer was washed with water and brine, and then dried over anhydrous magnesium sulfate. The solvent was vaporized to produce yellow oil, which was column chromatographed using hexane as an eluent to produce a colorless oil bromide (yield: 52%, 6.0 g.)

(3) Synthesis of Precursor Polymer 134 mg (1.13 mmol) of potassium-tert-butoxide dissolved in 3 ml of anhydrous THF solution was added to 0.5 g (1.26 mmol) of 2-dimethylphenylsilyl-1,4-bis(bromomethyl)benzene dissolved and stirred in 3 ml of anhydrous THF which was cooled in acetone and ice in a nitrogen atmosphere, thus producing a viscous blue solution. After ten minutes, the reaction mixture was heated to room temperature, and then stirred for 2 hours. The stirred reaction mixture was added dropwise to 25 ml of methanol which was cooled in ice to precipitate a precursor polymer. The resulting solution with the precipitation was filtered and the residue, that is, the precursor polymer, was dried under a vacuum condition. The precursor polymer was dissolved in an anhydrous chloroform, and then a large amount of methanol was added thereto to re-precipitate the polymer. The resulting solution was filtered, and the residue was collected. Then, the precipitation process was repeated two times, thus producing a blue solid polymer (yield: 50%, 0.20 g.)

(4) Manufacture of Patterned Buffer Layer 100 parts by weight of the precursor polymer, 5 parts by weight of cyclohexanone, and 0.2 parts by weight of (2,6-dinitrobenzyl)oxycarbonyl diphenylamine as a photobase generator were spin coated to a thickness of 100 nm on a substrate, and then heated to 80° C. for 2 hours. The coated substrate was exposed to a mercury arc lamp including an I-line (365 nm) filter in room temperature in an ambient condition for 5 minutes. The exposed substrate was heat treated at 100° C. for 1 minute to remove a small amount of the residing organic solvent. The resulting substrate was developed using the cyclohexanone to remove non-exposed portions of the substrate. The developed portions were dried for several minutes to produce the patterned buffer layer.

(5) Manufacture of Organic TFT

A patterned buffer layer was formed on a substrate, and source and drain electrodes composed of MoW (thickness: 100 nm) with an oxidized surface were formed on the patterned buffer layer. An organic semiconductor layer composed of pentacene (thickness: 70 nm), which is an organic semiconductor material, was formed to cover the patterned buffer layer and the source and drain electrodes. An insulating layer composed of $SiO_2$ (thickness: 200 nm) or an insulating material (thickness: 800 nm) was formed on the organic semi-conductor layer. A gate electrode composed of Al (thickness: 150 nm) was formed on the insulating layer to completely manufacture an organic TFT.

Comparative Example 1

Source and drain electrodes composed of MoW (thickness: 100 nm) with an oxidized surface were formed on a substrate. An organic semiconductor layer composed of pentacene (thickness: 70 nm) was formed to cover the source and drain electrodes. An insulating layer composed of $SiO_2$ (thickness: 200 nm) or an insulating material (thickness: 800 nm) was formed on the organic semiconductor layer. A gate electrode composed of Al (thickness: 150 nm) was formed on the insulating layer.

Results and Analysis

FIG. 5 is SEM images of buffer layers with pattern widths of 10 μm, 20 μm, and 30 μm manufactured according to Example 1. However, in the Comparative Example 1, such micro patterns were not formed. Therefore, it was confirmed that a photolithography micro pattern could be obtained using a halo precursor containing silicon according to an embodiment of the present invention.

The electric field mobility of the TFT including the micro-patterned buffer layer according to Example 1 was 0.05 $cm^2$/Vs, at least two times greater than 0.02 $cm^2$/Vs, the electric field mobility of the TFT excluding the micro-patterned buffer layer according to Comparative Example 1.

The current on/off properties of the TFT including the micro-patterned buffer layer were $5 \times 10^3$ at least two times greater than that of the TFT excluding the micro-patterned buffer layer.

According to the present invention, a patterned buffer layer can be formed under an organic semiconductor layer of an organic TFT by photolithography patterning using a halo polymer containing silicon. The formation of the patterned buffer layer results in the following effects.

First, the mobility of the organic TFT can be increased by improving the alignment of the organic semiconductor layer of the organic TFT, and thus, the characteristics of the organic TFT can be improved.

Second, the alignment of the organic semiconductor layer can be improved because the thickness of the buffer layer and the size of a pattern in the buffer layer can be easily controlled, and thus, the characteristics of the organic TFT device can be optimized.

Third, since the buffer layer composed of a halo precursor including silicon has high thermal stability, the buffer layer is suitable for an organic TFT.

Fourth, since the buffer layer composed of the halo precursor including silicon is not dissolved in an organic solvent, a swelling phenomenon that occurs when an organic semiconductor is coated can be prevented. As a result, more various organic semiconductor materials that is processable in an organic solvent can be used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A composition for forming a buffer layer of a thin film transistor which is used to form a polyparaphenylenevinylene (PPV) compound represented by Formula 1:

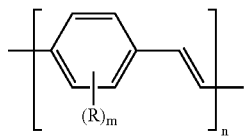

(1)

where R is a C1-C20 silyl group substituted with cyclohexyl or phenyl, m is an integer from 2 to 4, and n is an integer equal to or more than 1, the composition comprising:
a photobase generator;
a solvent; and
a precursor represented by Formula 2:

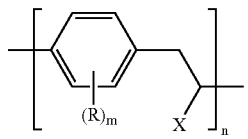

(2)

where R is a C1-C20 silyl group substituted with cyclohexyl or phenyl;
m is an integer from 2 to 4;
X is Cl, Br, or I; and
n is an integer equal to or more than 1,
wherein the amount of the solvent is in the range of 1 to 20 parts by weight based on 100 parts by weight of the precursor.

2. The composition of claim 1, wherein the photobase generator is represented by Formula 3:

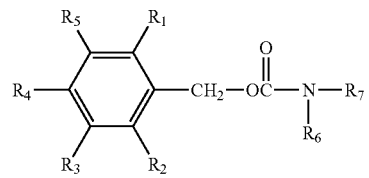

(3)

where $R_1$, $R_2$, $R_3$, $R_4$, and $R_5$ are each independently hydrogen, a C1-C10 alkyl group, a phenyl group, a C1-C10 alkoxy group, an $N(R')_2$ group, a $Si(R'')_3$ group, or a nitro group where R' and R'' are each independent hydrogen or a C1-C 10 alkyl group, at least one of $R_1$ and $R_2$ is the nitro group; and $R_6$ and $R_7$ are each independently hydrogen, a C1-C 10 alkyl group, or a substituted or unsubstituted $C_6$-C 20 aryl group.

3. The composition of claim 1, wherein the amount of the photobase generator is in the range of 0.1 to 10 parts by weight based on 100 parts by weight of the precursor.

4. The composition of claim 1, wherein the photobase generator is (2,6 dinitrobenzyl)oxycarbonyldiphenylamine.

5. The composition of claim 1, wherein the solvent is cyclohexanone.

* * * * *